US008515093B2

(12) United States Patent
Bhandari et al.

(10) Patent No.: US 8,515,093 B2
(45) Date of Patent: Aug. 20, 2013

(54) INPUT SIGNAL MISMATCH COMPENSATION SYSTEM

(75) Inventors: Sanjay M. Bhandari, San Jose, CA (US); Paul D. Smith, San Francisco, CA (US); Jiang (Jennifer) Yu, Richardson, TX (US); Sheng-Yu Peng, Vista, CA (US); Priscilla E. Escobar-Bowser, Plano, TX (US)

(73) Assignee: National Acquisition Sub, Inc., Santa Clara, CA (US)

( * ) Notice: Subject to any disclaimer, the term of this patent is extended or adjusted under 35 U.S.C. 154(b) by 222 days.

(21) Appl. No.: 12/900,322

(22) Filed: Oct. 7, 2010

(65) Prior Publication Data

US 2011/0085686 A1 Apr. 14, 2011

Related U.S. Application Data

(60) Provisional application No. 61/250,455, filed on Oct. 9, 2009, provisional application No. 61/254,538, filed on Oct. 23, 2009.

(51) Int. Cl.
*H04R 3/00* (2006.01)
*H03G 5/00* (2006.01)

(52) U.S. Cl.
USPC ................. 381/92; 381/98; 381/99; 381/102; 381/103; 381/104; 381/105; 381/106; 381/107; 381/108; 381/109; 381/111; 381/120; 381/122; 381/313

(58) Field of Classification Search
USPC ............... 381/92, 98–99, 102–109, 111, 120, 381/122, 312–318
See application file for complete search history.

(56) References Cited

U.S. PATENT DOCUMENTS 4,509,155 A * 4/1985 Masuda et al. ............ 369/47.26
4,688,017 A * 8/1987 Huebner et al. .............. 341/137

(Continued)

FOREIGN PATENT DOCUMENTS

DE 199 34 724 A1 4/2001
EP 0 982 971 A2 3/2000

(Continued)

OTHER PUBLICATIONS

PCT International Search Report for PCT/US2010/051873 dated Dec. 23, 2010.

(Continued)

*Primary Examiner* — Brian Ensey
*Assistant Examiner* — Katherine Faley
(74) *Attorney, Agent, or Firm* — Alan A. R. Cooper; Wade J. Brady, III; Frederick J. Telecky, Jr.

(57) ABSTRACT

A system includes a plurality of inputs each configured to receive a filtered version of a source signal. The system extracts the energy information from each input signal and compares the energy information of a plurality of input signals. Alternatively, the system extracts energy information from a signal that is the difference of two input signals. Based on the energy information, the system determines at least one parameter that may be changed in at least one circuit in a plurality of circuits to minimize the differences in energy of the input signals or to minimize the energy of the difference signal. Parameters may include for example amplification, delay, and corner frequency values.
The set of circuits may include microphone interface circuits. Merely by way of example, a system with microphone interface circuits may be included in a hearing enhancement device or in a hands-free earpiece.

13 Claims, 6 Drawing Sheets

(56) References Cited

U.S. PATENT DOCUMENTS

| | | | | |
|---|---|---|---|---|
| 6,385,323 | B1 * | 5/2002 | Zoels | 381/313 |
| 7,155,019 | B2 | 12/2006 | Hou | |
| 7,203,323 | B2 | 4/2007 | Tashev | |
| 7,529,377 | B2 * | 5/2009 | Nackvi et al. | 381/103 |
| 2002/0034310 | A1 * | 3/2002 | Hou | 381/92 |
| 2005/0169483 | A1 | 8/2005 | Malvar et al. | |
| 2006/0222187 | A1 * | 10/2006 | Jarrett et al. | 381/92 |
| 2008/0175407 | A1 * | 7/2008 | Zhang et al. | 381/92 |

FOREIGN PATENT DOCUMENTS

| | | | |
|---|---|---|---|
| EP | 1 773 098 | A1 | 4/2007 |
| WO | WO-01/10169 | A1 | 2/2001 |

OTHER PUBLICATIONS

Chinese Office Action dated Oct. 16, 2012.

English version of claims pending in Chinese Patent Application, as of Oct. 16, 2012.

* cited by examiner

INPUT SIGNAL MISMATCH COMPENSATION SYSTEM

CROSS-REFERENCE TO RELATED APPLICATIONS

The present application claims benefit to U.S. provisional applications 61/250,455 filed Oct. 9, 2009, titled MICROPHONE CALIBRATION SYSTEM ARCHITECTURES TO COMPENSATE FOR MICROPHONE GAIN AND PHASE DIFFERENCES, and 61/254,538 filed Oct. 23, 2009, titled HIGH RESOLUTION ARCHITECTURE AND EFFICIENT PROCEDURES FOR AUTOMATIC MICROPHONE MISMATCH CALIBRATION, the contents of each of the foregoing applications incorporated herein in their entirety.

BACKGROUND

Many signal capture systems include multiple inputs to allow for improved system performance over single-input systems. For example, an acoustic system may use multiple microphone inputs. A multiple-microphone system may be designed to have closely matched microphone inputs for optimal system performance. However, matching may degrade with time and use, introducing distortion into a captured acoustic signal or degradation of system performance. Therefore, it may become necessary to compensate for mismatched microphone inputs to maintain acceptable performance levels within the acoustic system.

SUMMARY

In accordance with an embodiment of the present invention, a method is provided. the method comprises determining, in a computing device in a first predefined frequency band within a first predefined time period, a first energy difference between two signals, wherein each of the two signals is received from a circuit in a plurality of circuits and is a filtered version of a source signal received by the circuit; determining, in the computing device in a second predefined frequency band within a second predefined time period, a second energy difference between the two signals; determining parameter modification information for the plurality of circuits based on the first and second energy differences, wherein the parameter modification information includes a corner frequency value of a high pass filter in the plurality of circuits; providing parameter modification information to the plurality of circuits; establishing an energy difference profile based at least on the first and second energy differences and the first and second frequency bands; determining a threshold frequency for which an energy difference is substantially the same for frequencies above the threshold frequency and substantially different for frequencies below the threshold frequency; setting a corner frequency value based on the threshold frequency; and providing the corner frequency value to an input circuit as the corner frequency of the high pass filter.

In accordance with an embodiment of the present invention, the method further comprises: defining the first predefined frequency band by an analysis circuit high pass filter corner frequency and an analysis circuit first low pass filter corner frequency; and defining the second predefined frequency band by the analysis circuit high pass filter corner frequency and an analysis circuit second low pass filter corner frequency, such that the analysis circuit second low pass filter corner frequency is higher than the analysis circuit first low pass filter corner frequency.

In accordance with an embodiment of the present invention, the method further comprises: defining the first predefined frequency band by an analysis circuit first high pass filter corner frequency and an analysis circuit low pass filter corner frequency; and defining the second predefined frequency band by an analysis circuit second high pass filter corner frequency and the analysis circuit low pass filter corner frequency, such that the analysis circuit second high pass filter corner frequency is higher than the analysis circuit first high pass filter corner frequency.

In accordance with an embodiment of the present invention, the steps of determining the first and second energy differences each further comprise: generating a difference signal that is the difference of the two signals; and determining an energy of the difference signal, wherein the parameter modification information includes one of a high pass filter corner frequency for adjusting a high pass filter in the plurality of circuits, and a delay value for adjusting the delay of a delay circuit in the plurality of circuits.

In accordance with an embodiment of the present invention, a method is provided. The method comprises: receiving a first input signal from a circuit within a plurality of circuits, wherein the first input signal is a filtered version of a first source signal filtered at least by delaying the first source signal in a first delay circuit within the plurality of circuits; receiving a second input signal from a circuit within the plurality of circuits, wherein the second input signal is a filtered version of a second source signal filtered at least by delaying the second input signal in a second delay circuit within the plurality of circuits; filtering the first input signal with a first bandpass filter in a first frequency band and filtering the second input signal with a second bandpass filter in the first frequency band; generating a difference signal that is a difference of the first input signal and the second input signal; determining a first energy difference between the first and second input signals filtered in the first frequency band by determining an energy of the difference signal; determining delay values for the first and second delay circuits based on the first energy difference; filtering the first input signal with the first or a third bandpass filter in a second frequency band, wherein the first source signal is further filtered by a second delay circuit within the plurality of circuits; filtering the second input signal with the second or a fourth bandpass filter in the second frequency band; wherein the second source signal is further filtered by a fourth delay circuit within the plurality of circuits; determining a second energy difference between the first and second input signals filtered in the second frequency band by determining an energy of the difference signal; and determining delay values for the second and fourth delay circuits based on the second energy difference and providing the delay values to the plurality of circuits.

In accordance with an embodiment of the present invention, the first source signal is further filtered by a first high pass filter and the second source signal is further filtered by a second high pass filter, further comprising: determining corner frequency values for the first high pass filter and the second high pass filter based on the first energy difference.

In accordance with an embodiment of the present invention, the method further comprises: selecting parameter modification information from the delay values and the corner frequency values; and providing the parameter modification information to the plurality of circuits.

In accordance with an embodiment of the present invention, an apparatus is provided. The apparatus comprises an input circuit having a plurality of input channels and having a filter circuit; and a mismatch compensator having: an energy measurement circuit that is coupled to the input circuit and that is configured to determine a first energy difference for a first frequency band and a second energy difference for a second frequency band between at least two of the channels; a compensation circuit that is coupled to the energy measurement circuit and the input circuit, wherein the energy measurement circuit is configured to determine a threshold frequency based at least in part on the first and second energy differences, and wherein the compensation circuit is configured to adjust the filter circuit based at least in part on the threshold frequency.

In accordance with an embodiment of the present invention, the threshold frequency has an energy difference that is the same for frequencies that are greater than the threshold frequency and that is substantially different for frequencies that are less than the threshold frequency.

In accordance with an embodiment of the present invention, the filter circuit further comprises a high pass filter.

In accordance with an embodiment of the present invention, the energy measurement circuit further comprises a plurality of rectifiers, wherein each rectifier is coupled to the input circuit, and wherein each rectifier corresponds to at least one of the input channels; a plurality of integrators, wherein each integrator is coupled to at least one of the rectifiers; and a difference circuit that is coupled to the plurality of integrators.

In accordance with an embodiment of the present invention, the apparatus further comprises a plurality of microphones, wherein each microphone is coupled to at least one of the channels.

In accordance with an embodiment of the present invention, the integrator further comprises: a input stage; a comparator that is coupled to the input stage; a delay circuit that is coupled to the comparator and the input stage; and a counter that is coupled to the delay circuit.

DETAILED DESCRIPTION

Figure 1:
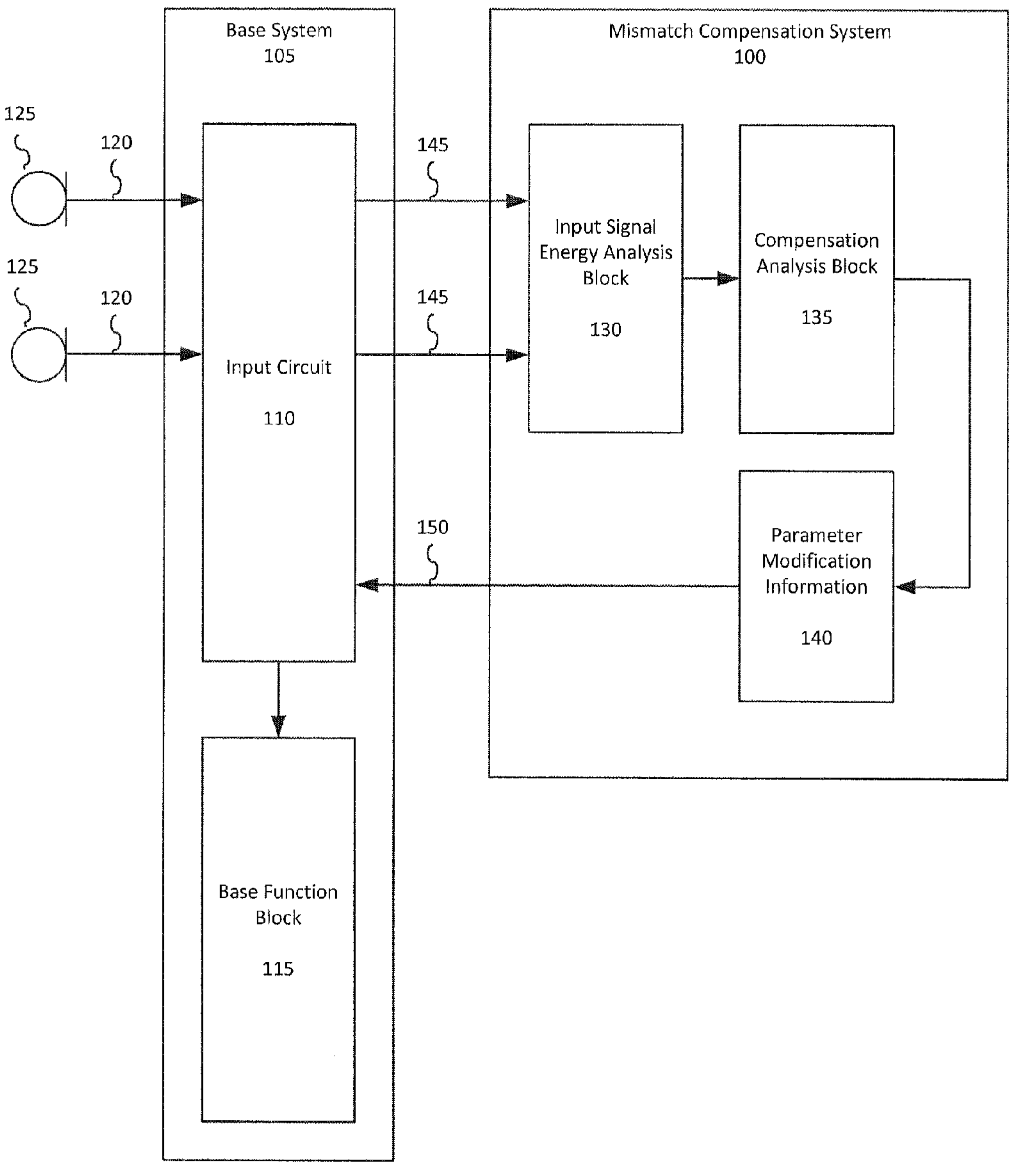
FIG. 1 illustrates an exemplary input signal mismatch compensation system.

Refer now to the drawings wherein depicted elements are, for the sake of clarity, not necessarily shown to scale and wherein like or similar elements are designated by the same reference numeral through the several views.

Many acoustic signal capture systems include multiple microphones that may be used for a wide range of applications, including, but not limited to, ambient noise detection, interferer noise detection, sound source triangulation, and directional pickup. The passage of time, use or misuse, and latent manufacturing differences may cause the multiple microphones to become mismatched in unpredictable ways, causing system performance to become degraded. It is therefore beneficial to provide the capability to resynchronize or otherwise match the multiple microphones as needed. Matching may include gain matching, frequency response matching, and phase matching.

Microphone matching may be performed with a known input signal under ideal test conditions, such as a narrowband sinusoidal signal with artificial low power ambient noise in a controlled temperature and humidity environment. However, such a controlled environment is not realistic for many end-users who are limited to the environments of their daily lives at home, work, and play. In such environments, the ambient noise may be at a high power, and an input signal used for matching the microphones may have a power level not much higher than the ambient noise. For example, an end user may wish to perform microphone matching by saying "testing, testing" while outside with ambient background noise including vehicle traffic and conversation. A system may be implemented with high precision mismatch compensation to provide adequate noise cancellation in such an environment.

One solution for high precision compensation in a signal capture system compares the energy received from multiple sources to determine adjustment for various parameters of the system.

Mismatch Compensation System Overview

FIG. 1 illustrates an exemplary mismatch compensation system 100 for input source mismatch compensation using input signal energy information to determine adjustments for system parameters. System 100 is shown in communication with a base system 105 through exemplary connections 145 and 150.

Base system 105 includes an input circuit 110, a base function block 115, and multiple input signals 120 from multiple input sources 125. Base system 105 represents a system in which it would be advantageous for the multiple input signals 120 to be synchronized or otherwise matched to each other. An example of a base system 105 is an acoustical system with multiple microphone inputs. Depending on the exemplary implementation, base system 105 may include analog components, digital components, or a combination of analog and digital components; may include firmware and/or software; and may be implemented on one or more integrated circuit chips. Input circuit 110 and base function block 115 may be independently physically implemented, for example, input circuit 110 may be a removable and replaceable component of base system 105.

The term block encompasses a mechanism that may be implemented in one or more circuits.

Connections between the components and systems are illustrated using arrows to indicate signal or information flow for the purposes of adding clarity to the following discussion. However, it should be understood that signal or information flow may be bi-directional between each of the components or systems, and there may be additional communication between components and systems other than that shown in FIG. 1.

Mismatch compensation system 100 includes an input signal energy analysis block 130, a compensation analysis block 135, and parameter modification information 140. System 100 analyzes the inputs to base system 105 and provides information to base system 105 to use to compensate for input signal 120 mismatch. Some examples of system 100 include, but are not limited to, a calibration system external to base system 105, a configuration system built into base system 105 with separate circuit boards, and configuration circuitry on an input circuit 110 circuit board. Further, by way of example, system 100 may be in the form of an integrated circuit, and may be implemented in an integrated circuit chip alone or along with portions of, or all of, base system 105.

In one illustrative approach, input circuit 110 of base system 105 may represent physical components and related configuration software that interface the multiple signal inputs 120 to the rest of base system 105. Physical components include discrete components such as transistors, resistors, capacitors, and diodes. Physical components also include integrated circuits. For example, a low voltage signal may be amplified in an integrated circuit before processing it, and the signal also may be filtered with resistors and capacitors to protect logic circuits in base system 105 from transient electrical signals. Various parameters of the components of input circuit 110 may be configurable via hardware or software or a combination of hardware and software. Merely by way of example, one configuration arrangement may store a trim value in a register that switches in resistive elements.

Base function block 115 of base system 105 represents a combination of physical components, or a combination of physical components and software, that implement the functionality of base system 105. For example, if base system 105 is a hearing aid, input circuit 110 would amplify and filter signals from the hearing aid microphones, and base function block 115 would process the amplified and filtered signals to determine what signals to output to the hearing aid speaker.

Input signals 120 into base system 105 represent any of a broad category of signals transmitted wirelessly or through a wired interface and include but are not limited to signals in the form of voltage, current, magnetic field, or electrical field. The signals may be transmitted at any frequency including audio frequencies, radio frequencies, optical frequencies, and ultraviolet frequencies.

Input sources 125 represent any sources for transmitting input signals 120 as described. Input sources 125 are shown in FIG. 1 as microphones for ease of understanding, but may be any signal sources, and may be any precision and accuracy. The set of input sources 125 includes any number of sources 125 and is not limited to two as illustrated. Further, although generally the sources 125 would be of the same make and model this is not a requirement for mismatch compensation as described below.

As can be appreciated, mismatch compensation would be useful in a wide variety of base systems 105. In a first example of input sources 125, a set of sources may include two low accuracy wireless microphones for use in a stage presentation, where mismatch compensation would allow consistent volumes for each presenter. In another example, a set of sources 125 may be multiple high precision microphones inside a hands-free telephone earpiece, where mismatch compensation would allow for effective wind noise cancellation. In yet another example, a set of sources 125 may be inputs from audiovisual equipment, where mismatch compensation would allow for consistent brightness across a composite picture.

Moving now to mismatch compensation system 100, input signal energy analysis block 130 represents circuits and/or functions for determining energy in signals, and may be any combination of digital or analog circuitry and may also include signal processing. Energy analysis in one exemplary implementation is described below with respect to FIG. 2.

Compensation analysis block 135 in system 100 represents circuits and/or functions for determining parameter modification for input circuit 110 based on the energy analysis information from block 130. Block 135 determines circuit 110 parameters that lead to optimized matching of the received input signals 120 as well as optimized matching for the signal paths in circuit 110.

Parameter modification information 140 in system 100 represents the output from compensation analysis block 135, used to adjust parameters of input circuit 110 in base system 105 by way of connection 150. Information 140 may be, for example, register values to be stored in a memory for adjusting the gain of an amplifier. Once adjusted, input circuit 110 provides output to base function block 115 that is compensated for the mismatch of input signals 120 and the signal paths of circuit 110.

Connections 145 represent any interface from input circuit 110 of base system 105 to the input signal energy analysis block 130 of mismatch compensation system 100. Connections 145 include wired or wireless interfaces, and may transmit signals in either analog or digital form. In one example, connections 145 are copper wire over which analog voltage signals are transmitted. In another example, connections 145 are wireless interfaces over which radio frequency digital signals representing current are transmitted.

Connection 150 represents an interface from mismatch compensation system 100 to input circuit 110 of base system 100 over which parameter modification information may be transmitted. Connection 150 may be wired or wireless and information may be transmitted in any form or in any protocol. For example, connection 150 may be an RS-232 communication interface for setting register values. As another example, connection 150 may be an optical fiber passing light representing voltage thresholds for setting amplification levels.

Mismatch compensation in system 100 begins with an analysis of the energy in the signals transmitted over connections 145.

Input Signal Energy Analysis

Figure 2A:
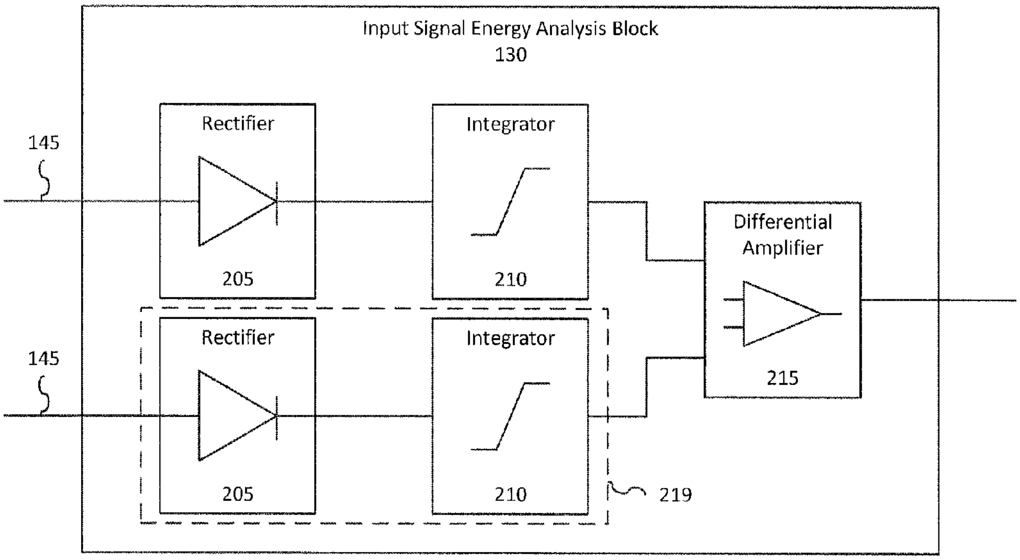
FIG. 2A illustrates an exemplary input signal energy analysis block.
Figure 2B:
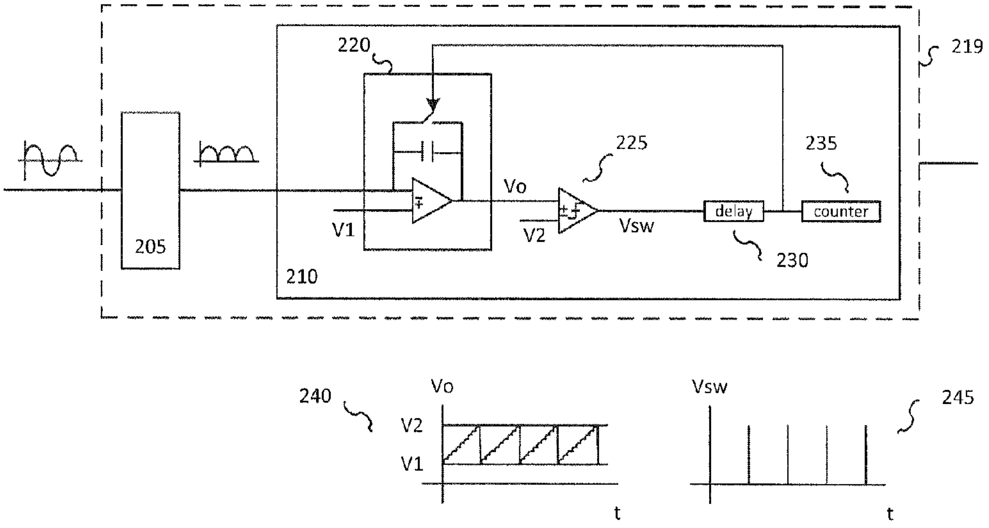
FIG. 2B illustrates an exemplary implementation of a rectifier and an integrator of an input signal energy analysis block.

FIG. 2A illustrates an exemplary implementation for an input signal energy analysis block 130 including rectifier blocks 205, integration blocks 210, and a differential amplifier block 215. Each of the blocks included in energy analysis block 130 may represent any combination of physical components, or physical components and software, that together performs the function of the block. Multiple portions of input signal energy analysis block 130 may be implemented on one integrated circuit. Further, blocks 205, 210 and 215 may operate in the analog or digital domains, and may thus include digital-to-analog converters and/or analog-to-digital converters. For example, connections 145 may be used to pass digital signals, and therefore at least rectifiers 205 would include a digital signal component. In another example, all of the blocks 205, 210 and 215 may be implemented as digital signal processing functions. FIG. 2B, described below, illustrates a combination of digital and analog processing for integrator 210. As can be seen, each block of input signal energy analysis block 130 illustrates a capability and not a specific implementation.

Rectifier block 205 converts a signal received as a combination of positive and negative values into a signal including only positive values. Rectification may be partial or full. Partial rectification passes only the positive elements of the original signal. Full rectification passes the positive elements of the original signal and also passes the negative elements of the original signal after sign inversion. In the example of FIG. 2A, there is at least one rectifier block 205 for each connection 145, which generally corresponds to one rectifier block 205 for each input signal 120.

Integration block 210 sums the output from the associated rectifier block 205 over a period of time. The period of time may be, for example, started by the user pressing a start button and ended by the user pressing a stop button. In another example, the period of time may be reprogrammed into the circuits or software of the analysis block 130, or may be started or stopped by a signal crossing a threshold. The output of integration block 210 is representative of the energy of the corresponding input signal. In the example of FIG. 2A, there is at least one integration block 210 for each rectifier block 205.

Differential amplifier block 215 compares the outputs of integrator blocks 210 and amplifies the difference. The output of differential amplifier block 215 is representative of the difference in the energy of the input signals 120. The output of block 215 is input to compensation analysis block 135 of FIG. 1, where it is used to determine parameters to adjust in input circuit 110. Differential amplifier block 215 may be a comparator.

The component arrangement shown in FIG. 2A is illustrative of the concept for gain mismatch compensation. However, the arrangement of FIG. 2A is not limiting, and the components may be rearranged in different order. As one example, connections 145 may be inputs for differential amplifier 215, where the amplifier 215 is followed by an integrator 210 and then a rectifier 205. In another example, connections 145 may be inputs for rectifiers 205, where the rectifiers 205 are followed by a differential amplifier 215 and then an integrator 210. Other arrangements of the components shown in FIG. 2A may be chosen to optimize performance, cost, accuracy, size, or other attribute of input signal energy analysis block 130. Further, there may be more or fewer components than shown. For example, a high pass filter may be included to eliminate the DC component of the signals to prevent a DC offset between the signals from causing errors in the mismatch calculation and adjustment. Such a high pass filter may be implemented for this purpose as AC coupling.

Input signal energy analysis block 130 may be configured differently for base systems 105 with more than two input sources 125. For example, there may be a first level of differential amplifiers 215, one for each set of two connections 145, and a second level of differential amplifiers 215 for differential amplification of the outputs of the first level of amplifiers 215.

Box 219 in the input signal energy analysis block 130 includes a rectifier 205 and an integrator 210. One example for implementing the features of box 219 is illustrated in FIG. 2B.

FIG. 2B includes an integrator 210 following a full wave rectifier 205, illustrating a combination of analog and digital processing within an integrator 210 of input signal energy analysis block 130. A rectified signal is the input to a first stage 220 with capacitive feedback element(s) and in parallel a switch to short the feedback path. When the capacitive feedback element is discharged, the output voltage Yo of the first stage is equal to the reference voltage VI. As the capacitive feedback element charges, the output Yo of the first stage increases from VI. If the shorting switch is closed, the capacitive feedback element is discharged and the output Yo rapidly decreases to VI.

The output Yo of the first stage is input to a comparator 225 with reference threshold V2. When Yo is less than V2, the output Vsw of the comparator 225 is approximately equal to zero, or at the "logic zero" state. When Yo is greater than V2, output Vsw is equal to the comparator power supply voltage, or some other voltage set by the circuitry, which is referred to as the "logic one" state.

Delay 230 feeds back a "logic one" on Vsw to the shorting switch after a delay. A "logic one" causes the switch to close and the capacitive feedback element to discharge such that the output Yo falls to VI, and Vsw changes to a "logic zero". The "logic zero" causes the switch to open after a delay. The delay is set to a value as necessary for system stability. For example, the delay may be set for a period of time required for the switch to settle.

In an analysis of integrator 210, initial conditions are set such that the shorting switch is in a closed position, Vo=VI, and Vsw equals the "logic zero" state. At some starting time the shorting switch is opened, allowing the capacitive feedback element to charge, so that Yo increases from VI at a rate that is a function of the energy in the signal. When Yo crosses threshold V2, the output Vsw of comparator 225 changes to "logic one", which propagates through delay 230 and eventually causes the shorting switch to close. The shorted feedback path causes first stage output Vo to fall to V1, which in turn causes Vsw to return to "logic zero".

Graph 240 illustrates Vo increasing from V1 to V2 over time t while the shorting switch is open and falling to V1 when the shorting switch is closed. Graph 245 illustrates Vsw alternating between "logic zero" and "logic one" over time t as the shorting switch is opened and closed. The more energy a signal has, the faster the capacitive feedback element of the first stage 220 will charge, causing Vsw to reach the "logic one" state more frequently.

Counter 235 counts the number of "logic one" values generated at Vsw during a given time period. Thus, the count represents the energy in the rectified signal over the time period. For example, if a signal has low energy, Vsw will be slow to reach the "logic one" state relative to higher-energy signals. Thus, in a defined time period, Vsw for a low energy signal may reach "logic one" only a few times and counter 235 will count only a few "logic ones", whereas the count of "logic ones" for a higher-energy signal during the same time period may be much higher.

The example of FIG. 2B illustrates integrator 210 implemented with a combination of analog and digital circuitry. There are multiple ways to implement an integrator 210, including fully analog or fully digital circuits. In a fully digital implementation, for example, the rectifier may be followed by an analog-to-digital converter, and integration performed by digital signal processing on the resulting digital signal.

Having provided an overview of a mismatch compensation system 100, exemplary implementations of system 100 for gain, frequency response, and/or phase mismatch compensation are now described.

Gain Mismatch Compensation

Figure 3:
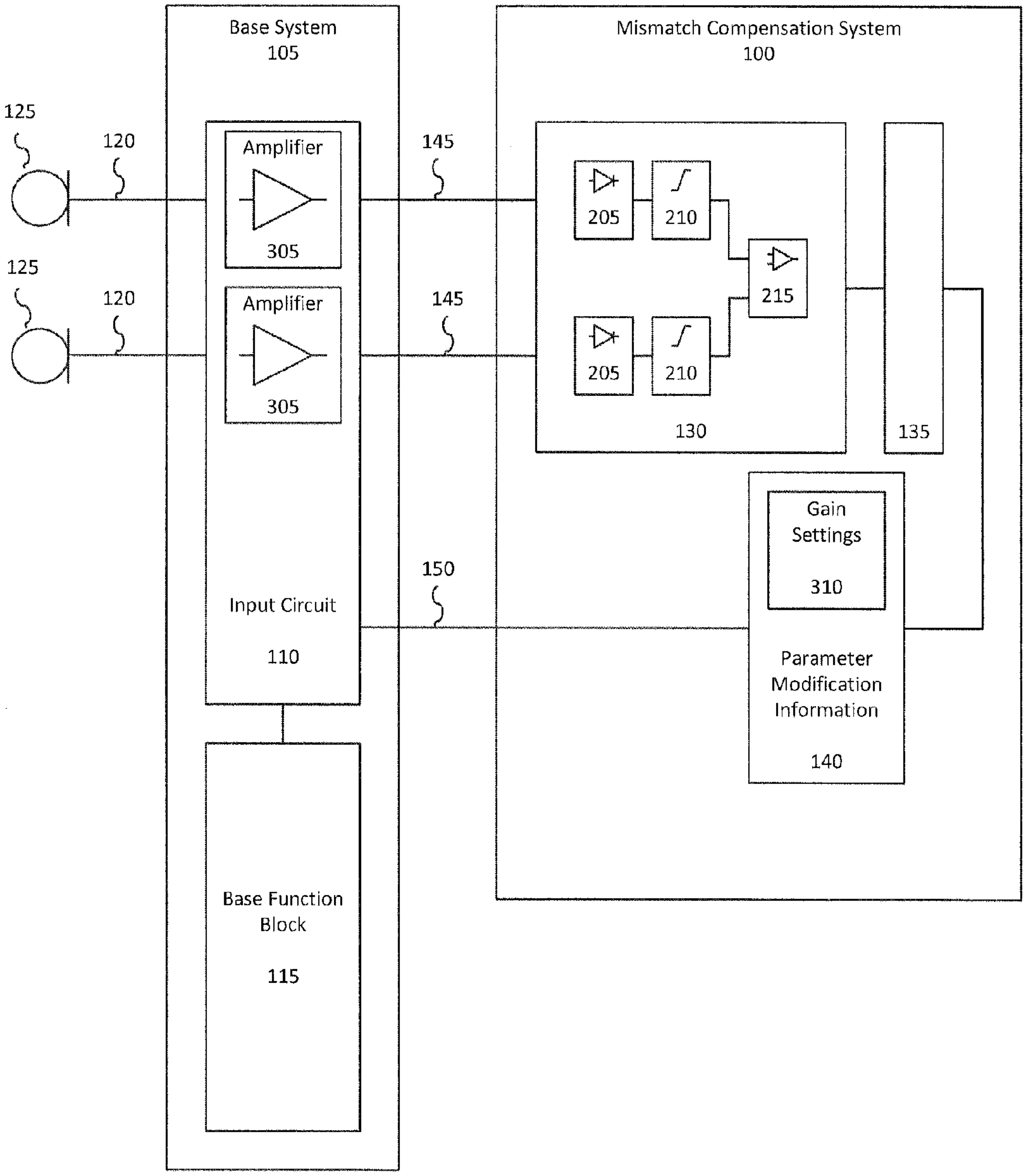
FIG. 3 illustrates an exemplary mismatch compensation system for input signal gain mismatch.

FIG. 3 illustrates an exemplary implementation of a system 100 for compensating input signal 120 gain mismatch. As illustrated, input circuit 110 of base system 105 includes an amplifier 305 for each input signal 120. Amplifiers 305 are representative of one or more amplification stages and may represent any combination of physical components, or physical components and software, that together perform the function of amplification of an input signal 120. Amplifiers 305 may be, for example, low noise amplifiers (LNAs) in the input stage of an acoustic system. Parameter modification information 140 in system 100 includes gain settings 310 for amplifiers 305. Gain settings 310 may be, for example, included in a data word saved to a memory location where the data word indicates silicon switch settings.

After energy analysis block 130 analyzes the difference in energy of the input signals 120, compensation analysis block 135 determines the relationship between the energy difference of the input signals 120 and the settings for the amplifiers 305. Determination of the relationship may be made, for example, by accessing the settings from a lookup table in a memory, where the table stores amplifier settings versus input energy difference values. Alternatively, the determination of the relationship may be made in a formulaic manner, where the energy difference is the input to a formula and the settings are outputs of the formula. Other alternatives exist for determining relationships, not limited to those described.

Having determined the relationship between the energy difference and the amplifier 305 settings, the settings are included in the parameter modification information 140 provided to input circuit 110 via connection 150 and are used to set the gain of the amplifiers 305.

In one exemplary gain compensation system 100, amplifier 305 settings are determined based on a set of input signals 120 from each source 125. For example, an end user may be prompted to speak into a set of microphones in a base system 105, first softly, then in a normal voice, and then in a loud voice. Continuing with this example, amplifier 305 settings may be determined at each volume, and the multiple settings used to optimize input signal 120 gain mismatch compensation for a range of volumes. In another example, multiple settings determined at multiple volumes may be stored and later used to dynamically adjust the amplifier 305 gain during use according to the volume at the microphones. Dynamic adjustment may be performed automatically in the system 100 or by end-user adjustment such as selecting between quiet, normal, and loud environments.

System 100 may, in addition to or instead of providing for gain mismatch compensation, provide for frequency response mismatch compensation.

Frequency Response Mismatch Compensation

Frequency response mismatch may occur due to manufacturing tolerance. For example, in the housing of an electric condenser microphone (ECM) there is a barometric relief hole (vent hole). The location, size, and shape of the vent hole may affect the corner frequency of a microphone's high pass filter characteristics, and therefore small differences in the vent holes of different microphones may cause the microphones to have different frequency responses. Frequency response mismatch may also occur due to tolerance of electrical components within a source 125. For example, a source 125 internal circuit may include a set of filters to create a specific frequency response profile, such as a microphone profile with narrow pass bands tuned specifically for certain vocal frequency ranges. In this example, the tolerances of the components in the internal circuit may make the same profile in two such sources 125 result in a frequency response mismatch. Frequency response mismatch can cause degradation of system performance in base function block 115.

Figure 4:
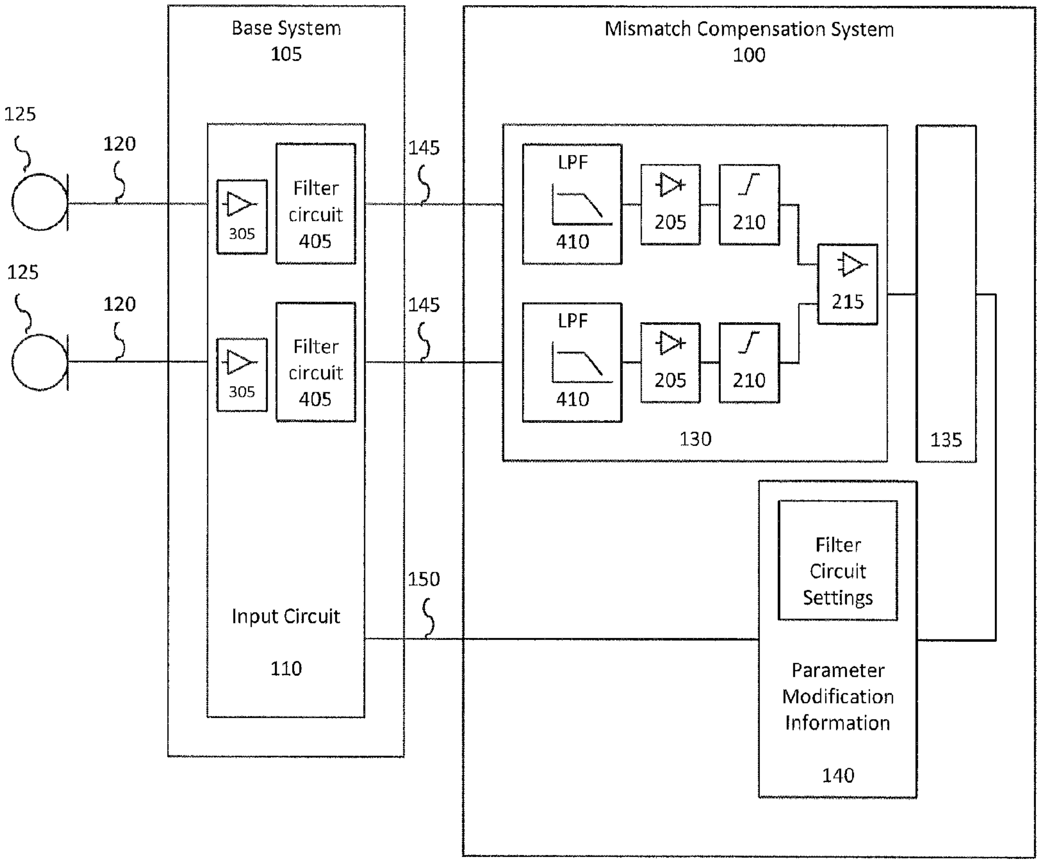
FIG. 4 illustrates an exemplary mismatch compensation system for input signal frequency response mismatch.

FIG. 4 illustrates an exemplary implementation of a system 100 for compensating input source 125 frequency response mismatch. As illustrated, input circuit 110 of base system 105 includes an amplifier 305 for each input signal 120 and further includes a filter circuit 405 for each input signal 120. Amplifiers 305 are described above. Filter circuit 405 represents any combination of physical components, or physical components and software, that together may selectively pass, amplify, attenuate, or block selected frequencies or frequency bands to shape the frequency profile of input signal 120. For example, a first source 125 may amplify more in a first frequency band and attenuate more in a second frequency band as compared to a second source 125, and in response system 100 may tune filter circuit 405 of the first source 125 to attenuate in the first frequency band and tune filter circuit 405 of the second source 125 to attenuate in the second frequency band.

As also illustrated in FIG. 4, input signal energy analysis block 130 may include low pass filters 410 in addition to the rectifiers 205, integrators 210, and differential amplifier 215 as described above. Low pass filters (LPFs) 410 are representative of one or more filtering stages that pass low frequencies and attenuate higher frequencies, and may represent any combination of physical components, or physical components and software, that together perform the function of low pass filtering. In the implementation shown in FIG. 4 there is at least one LPF 410 for each connection 145, which generally corresponds to at least one LPF 410 for each input signal 120. The outputs of LPFs 410 are inputs into rectifiers 205.

Frequency response mismatch compensation may be performed as follows. Each LPF 410 is set to a first corner frequency and the compensation analysis block 135 determines the difference in energy of the input signals 120 for a first frequency range up to the first corner frequency. Block 135 then outputs parameter modification information 140 based on the energy difference of the input signals 120. In the example of FIG. 4, parameter modification information 140 may include filter circuit 405 settings that adjust the gain or other parameter for the first frequency range.

Further frequency response mismatch compensation may be performed by setting LPFs 410 to a second corner frequency, determining the energy difference of the input signals 120 over a second frequency range up to the second corner frequency, and determining additional parameter modification information 140 for filter circuits 405 based on the energy difference. Parameter modification information 140 may include gain settings for bandpass filters in one or more filter circuits 405.

For example, for a given type of input source 125 there may be a known relationship between the energy at a first frequency and the energy at a second frequency. A known relationship may be as simple as knowing that energy is linearly related to frequency in a given type of microphone. In the case of a known linear relationship, the energy difference for input signals 120 over the frequency band between a first and a second corner frequency may be equal to the energy difference of input signals 120 with LPFs set to the second corner frequency minus the energy difference of input signals 120 with LPFs set to the first corner frequency. In this example, filter circuits 405 may be adjusted to compensate for gain mismatch in the frequency band between the first and second corner frequencies.

By finding the energy difference of input signals 120 at multiple LPF 410 corner frequencies, the frequency response mismatch of the input sources 125 may be compensated to the resolution desired. For example, determining the energy differences of the input signals 120 at ten different LPF 410 corner frequencies may provide for gain mismatch compensation over ten different frequency bands. Thus, the overall frequency response may be mismatch compensated to a coarse or fine resolution with a small or large set of bandpass filters, respectively.

Compensation analysis block 135 may perform analyses at multiple LPF 410 corner frequencies and select a subset of the resulting parameter modification information 140 to use in adjusting filter circuits 405. For example, energy differences determined at ten different LPF 410 corner frequencies may be used to provide for mismatch compensation in only a few frequency bands.

The component arrangement shown in FIG. 4 is illustrative of the concept for frequency response mismatch compensation. However, the arrangement of FIG. 4 is not limiting, and the components may be rearranged in different order. Further, there may be more or fewer components than shown. As one example, differential amplifier 215 may interface to connections 145, and the amplifier 215 may be followed by an integrator 210, then a rectifier 205, and then a LPF 410. In another example, rectifiers 205 may interface to the connections 145, followed by LPFs 410, then a differential amplifier 215, and then an integrator 210. Other combinations of the components shown in FIG. 4 may be chosen to optimize performance, cost, accuracy, size, or other attribute of input signal energy analysis block 130.

Further, as mentioned above, input signal energy analysis block 130 may be configured differently for base systems 105 with more than two input sources 125.

System 100 may provide for phase mismatch compensation in addition to or instead of providing for gain mismatch compensation and/or frequency response mismatch compensation.

Phase Mismatch Compensation

Phase mismatch between input signals 120 may occur, for example, when one input source 125 is farther away from base system 105 than another input source 125, or when the circuit paths through input circuit 110 are different lengths for different input signals 120. Phase mismatch can cause degradation of system performance in base function block 115.

Figure 5:
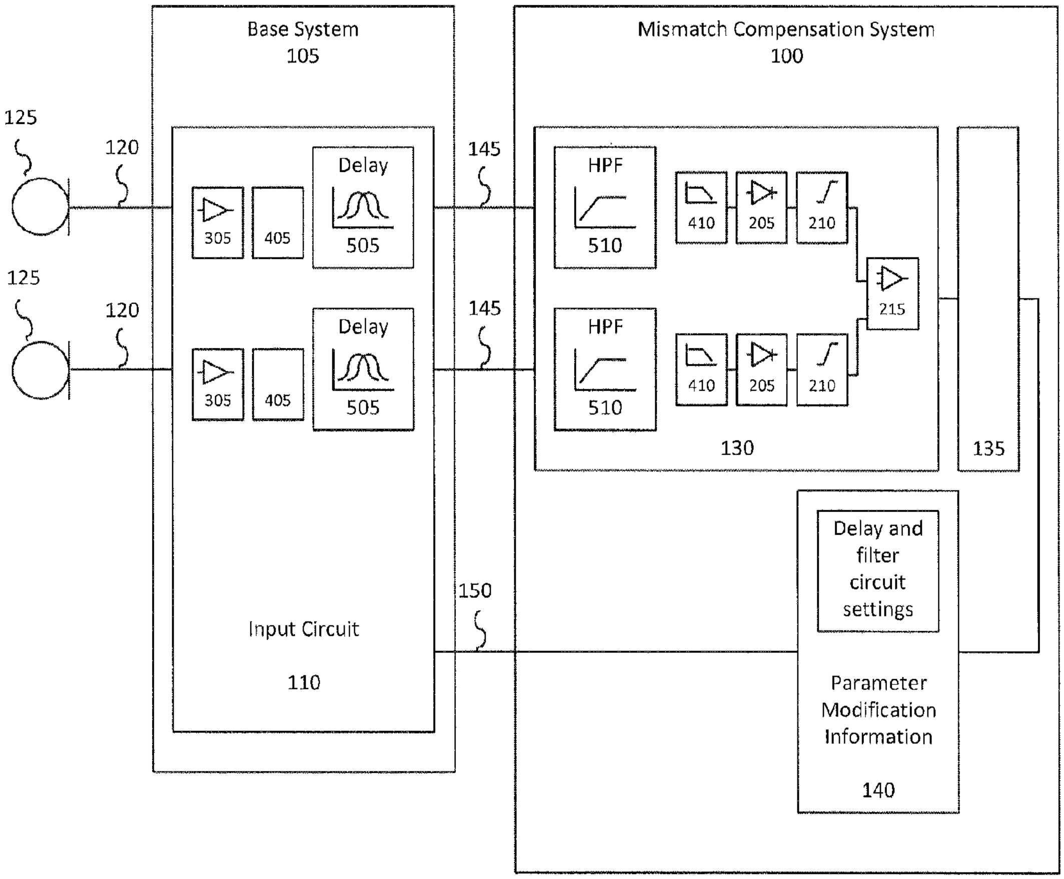
FIG. 5 illustrates an exemplary mismatch compensation system for input signal phase response mismatch.

FIG. 5 illustrates an exemplary implementation of a system 100 for compensating input signal 120 phase mismatch. As illustrated, input circuit 110 of base system 105 includes an amplifier 305, a filter circuit 405, and a delay block 505 for each input signal 120. Amplifiers 305 and filter circuits 405 are described above. Delay blocks 505 are representative of one or more stages that add a known delay to a signal, and may represent any combination of physical components, or physical components and software, that together perform the function of adding a delay.

Filter circuits 405 may be adjusted to compensate for known phase mismatch. For example, if a particular type of microphone is known to have a high degree of phase mismatch for frequencies up to 400 Hertz, high pass filters in filter circuits 405 could be adjusted to attenuate the corresponding input signals 120 in those frequencies by setting the corner frequency of the HPF 510 to 400 Hz.

Delay blocks 505 may be adjusted to compensate for known phase mismatch also. For example, in a 2×2 microphone array, meaning two rows and two columns of microphones, the first row and second row may be five inches apart. The five inch space may result in a five millisecond phase mismatch between the input signals 120 from the first row and second row. Thus, delay blocks 505 for the first row may be set to five milliseconds to compensate for the lag of the second row input signals 120. Delay blocks 505 may provide for frequency-dependent delays.

The description thus far includes compensation only for known phase mismatch. Input signals 120 may have unknown phase mismatch which must be identified and then compensated for. One method for identifying phase mismatch is described below with reference to FIG. 5.

FIG. 5 illustrates that mismatch compensation system 100 may include high pass filters (HPFs) 510 in addition to rectifiers 205, integrators 210, differential amplifier 215, and LPFs 410 as described above. HPFs 510 represent any combination of physical components, or physical components and software, that together may selectively attenuate low frequencies and pass higher frequencies.

To identify phase mismatch, compensation system 100 may adjust the LPF 410 and HPF 510 corner frequencies to determine frequency bands in which there are relatively large phase mismatches. Filter circuits 405 may then be adjusted to delay and/or attenuate input signals 120 in those high-mismatched bands as appropriate.

As a first example, system 100 may first set LPFs 410 corner frequencies to 500 Hz and HPFs 510 corner frequencies to 20 Hz and determine the energy difference between the input signals 120. Then, the corner frequencies of the LPFs 410 may be increased and the energy difference of the input signals 120 determined again. Continuing with the example, system 100 may determine a profile of the energy difference as the LPFs 410 corner frequencies are increased to determine what low frequency band has high mismatch. As a second example, system 100 may first set LPFs 410 corner frequencies to 1 kHz and HPFs 510 corner frequencies to 20 Hz and determine the energy difference between the input signals 120. Then, the corner frequencies of HPFs 510 may be increased and the energy difference of the input signals 120 determined again. Continuing with the example, system 100 may determine a profile of the energy difference as the HPFs 510 corner frequencies are increased to determine what low frequency band has high mismatch. In either of the first or second examples, filter circuits 405 may be adjusted to delay and/or attenuate within the identified band. Attenuation may include setting the corner frequencies of high pass filter circuits within filter circuits 405 to filter out some lower frequencies with high phase mismatch. As another example, an energy difference profile can be established based energy differences of multiple (e.g., two or more) frequency bands, and, based at least in part on this energy difference profile, a threshold frequency can be determined. This threshold frequency can correspond to a frequency in which the energy differences above the threshold are substantially or approximately the same, but are substantially different below the threshold.

As mentioned, phase mismatch compensation may be additional to gain and/or frequency mismatch compensation.

Figure 6A:
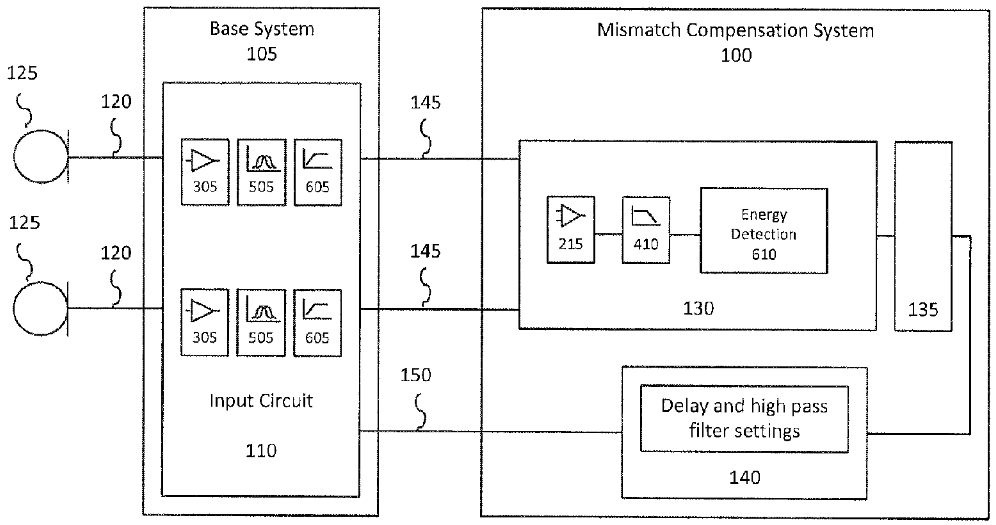
FIG. 6A illustrates another exemplary mismatch compensation system for input signal phase response mismatch.

FIGS. 6A/B illustrate additional exemplary implementations of a system 100 for compensating input signal 120 phase mismatch. As illustrated, input circuit 110 of base system 105 includes an amplifier 305, a delay block 505, and a high pass filter 605 for each input signal 120. Amplifiers 305 and delay blocks 505 are described above. High pass filter blocks 605 are representative of one or more stages that filter out frequencies above a selected corner frequency, and may represent any combination of physical components, or physical components and software, that together perform the function of high pass filtering.

FIG. 6A further illustrates input energy analysis block 130 including a differential amplifier 215, a low pass filter 410, and an energy detection block 610. Differential amplifiers 215 and low pass filters 410 are described above. Energy detection block 610 represents any physical components, or physical components and software, that together perform the function of energy detection. Energy detection may for example be performed as described above using rectification and integration. In the implementation of FIG. 6A, differential amplifier 215 determines a difference signal which is the difference of the signals received on connections 145. The difference signal is filtered with a low pass filter 410 to attenuate higher frequencies. The energy of the resulting difference signal may then be analyzed in energy detection block 610 and used by analysis block 135 to determine possible delay block 505 and/or high pass filter 605 settings. Parameter modification information 140 including delay block 505 and/or filter 605 settings may then be provided to input circuit 110.

Figure 6B:
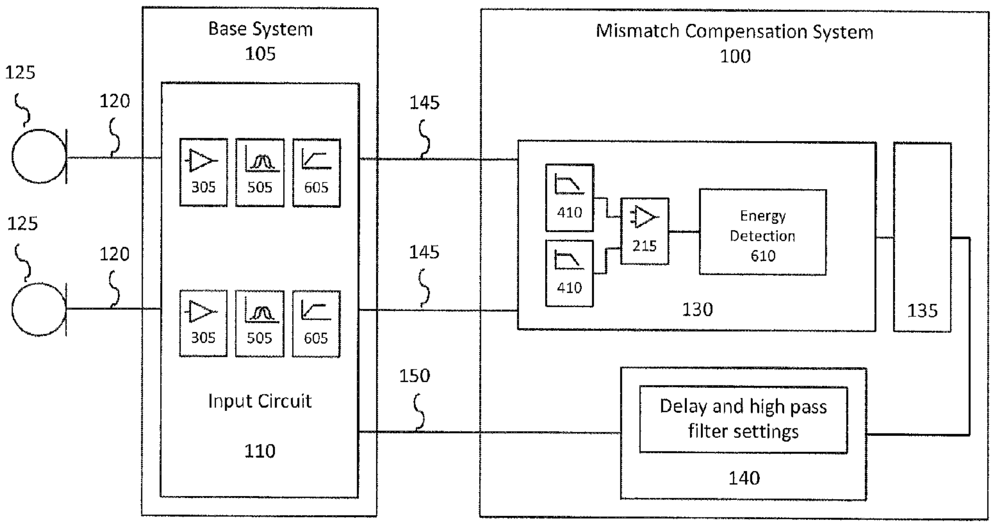
FIG. 6B illustrates another exemplary mismatch compensation system for input signal phase response mismatch.

FIG. 6B illustrates a variation on the energy analysis block 130 implementation of FIG. 6A in which the signals received on connections 145 are each low pass filtered with a filter 410 and then the difference signal determined in differential amplifier 215.

In the implementations of FIGS. 6A and 6B, a base system 105 with sources 125 may be tested in a controlled environment to determine calibration information. Parameter modification information 140 may be used to adjust input circuit 110 to minimize the energy in the difference signal at the output of differential amplifier 215. Energy analysis and input circuit 110 adjustment may be performed iteratively to determine optimal input circuit 110 parameters for minimum energy in the difference signal. When the energy has been minimized to an acceptable level, for example by falling below a threshold value, information 140 may also be used to set calibration values corresponding to the particular sources 125.

In one calibration example the implementation of input circuit 110 illustrated in FIG. 6A is connected to microphone sources 125 and a chirp signal is applied to the microphones. A chirp signal is generally a constant-amplitude signal that starts at one frequency and increases to another frequency in a relatively short period of time, for example ramping from 10 Hz up to 8 kHz in a fraction of a second. Before beginning the calibration, high pass filters 605 are adjusted to have a corner frequency at a first high frequency, fc1, and delays 505 are adjusted to compensate for expected delays. The chirp signal is applied and amplifiers 305 are adjusted to compensate for gain mismatch and delays 505 are adjusted to compensate for phase mismatch.

Continuing with the calibration example, high pass filters 605 are next set to a low corner frequency fc2. Low pass filters 410 are set to a corner frequency fc3 to isolate mismatch in the frequency band of interest. A chirp signal is applied to the microphones. Alternatively, a single tone may be applied at a frequency for which the microphones are expected to have a large phase mismatch. In either case, phase mismatch is determined in terms of the energy in the difference signal as described above. The corner frequencies of high pass filters 605 are then adjusted up until the energy in the difference signal is reduced to an acceptable level. In this way, input circuit 110 is adjusted to compensate for microphone phase mismatch at certain frequencies or in certain frequency bands by attenuating input signals 120 at those frequencies.

Further calibration may be performed in a controlled environment or in a field environment. Some examples are given in the section "Calibration Examples" below.

Combined Mismatch Compensation

A combination of gain mismatch compensation, frequency response mismatch compensation, and phase mismatch compensation may be performed in one mismatch compensation system 100.

In a combined compensation system 100, gain mismatch compensation combined with phase mismatch compensation may be performed to compensate for unknown phase mismatch between input signals 120. For example, two microphone input sources 125 in the same general vicinity receive approximately the same sound input. If the input signals 120 are integrated over a long enough period of time the signals 120 should have approximately the same energy because the microphones received approximately the same sound input. Thus, the energy difference between the two input signals 120 represents a sum of the differences in microphone output power, cable lengths, connector corrosion, and the like. The energy difference may be compensated for by setting the gain for amplifiers 305. Note in this example, however, that the input signals 120 may have a large phase mismatch even though the inputs have been compensated for long-period gain mismatch. The phase mismatch must be identified and compensated for separately.

Continuing with the example, after the input signals 120 are gain matched they should have approximately the same energy over each measurement period. Therefore, a consistent energy difference over multiple short periods may indicate a phase mismatch between the signals 120. An average energy difference over multiple time period samples may be used to determine an amount of delay to add to one of the input signals 120 to compensate for phase mismatch. In another combined compensation system 100, gain mismatch compensation and frequency response mismatch compensation may be performed in combination to optimize overall matching. For example, gain mismatch compensation may first be performed for two microphone input sources 125 over the whole audio frequency spectrum to adjust the relative volumes of the input signals 120. Frequency response mismatch compensation may then be performed for multiple frequency bands to provide better input signal 120 matching. Gain mismatch compensation and frequency mismatch compensation may be repeated one or more times for optimized matching.

In another combined compensation system 100, gain mismatch compensation, frequency response mismatch compensation, and phase mismatch compensation may be performed in combination to optimize overall matching. Gain and frequency response compensation may be performed as described in the previous example, followed by phase mismatch compensation.

In a further combined compensation system 100, frequency response mismatch compensation is performed, followed by phase mismatch compensation.

As can be seen from the descriptions and examples above, mismatch compensation system 100 tests the outputs from input circuit 110 and then provides parameter modification information 140 for input circuit 110. Many tests may be performed without changing input circuit 110 parameters prior to the test. If input circuit 110 parameters are not changed prior to performing a test, the testing may be conducted substantially concurrently with normal operation, for example in a background software routine. If input circuit 110 parameters are changed prior to performing a test, the testing may still be conducted unobtrusively by switching into and out of test mode quickly during normal operation.

Calibration Examples

Signal paths for input signals 120 through input circuit 110 may be unmatched in part due to manufacturing tolerances and design limitations, meaning that different signal paths inherently amplify and/or delay signals differently. This inherent mismatch may be calibrated out in the manufacturing environment by applying controlled signals as input signals 120 and adjusting components in the signal paths. For example, gain mismatch calibration may be performed in the manufacturing environment by using a single source 125 for multiple input signals 120 and adjusting amplifiers 305 until the signals on connections 145 have substantially equivalent energy levels. For another example, phase mismatch calibration may be performed in the manufacturing environment by using a single source 125 for multiple input signals 120, determining a difference signal for the input signals 120, and adjusting delays 505 to minimize the energy in the difference signal.

Base system 105 may be used in many different environments with many different source 125 types, as mentioned above. Each time that base system 105 is coupled to a different set of sources 125 it may be desirable to calibrate input circuit 110 to compensate for mismatch of the sources 125. In one example in which sources 125 are multiple miniature microphones mated to base system 105 in an earpiece, the earpiece may be calibrated as a unit. Calibration of the earpiece may be performed by applying a controlled audio signal to the microphones and adjusting input circuit 110 to compensate for gain and/or phase mismatch in the frequency bands of interest in any of the ways discussed above. Calibration may further be performed to adjust for expected signal delay due to source 125 placement. In the previous example, the earpiece may be oriented with respect to the controlled audio signal according to how it would be oriented on the human ear, and the signal delay resulting from the differing orientation may be calibrated out.

Additional calibration may be desirable for particular environments. For example, a base system 105 may be calibrated at manufacture and/or after mating with sources 125 for optimal performance over a broad frequency band. However, the system 105 may be consistently used in an environment with a particularly noisy background in a certain frequency range, such as a train yard. In this example, it may be desirable to calibrate the system 105 for optimal performance within the train yard by maximizing matching within the certain frequency range to allow for better noise cancellation by base function block 115.

Further, systems 105 may be calibrated at manufacture for targeted environments. For example, earpieces may be calibrated for optimized matching in high wind noise such that noise cancellation may be more effectively performed by base function block 115. Alternatively in this example, wind noise calibration settings for input circuit 110 may be stored and the settings used only when wind noise is detected or upon user request. Multiple other sets of calibration settings could also be stored for later retrieval.

From the examples above it can be seen that calibration may be performed at multiple stages along the path from manufacture to use of base system 105, and may include calibration in a controlled environment, calibration for a targeted environment, and calibration in the field to adapt to the ambient environment. Output quality from base function block 115 may be significantly improved when input circuit 110 is calibrated. Thus, circuit 110 adjustability in multiple environments may enable high quality output from base system 105.

Conclusion

Mismatch compensation system 100 may provide fast calibration for a base system 105 without adding great complexity and without using expensive high-precision components, and may provide the calibration quickly in an end-user environment.

Mismatch compensation system 100 may be a stand-alone calibration system. Alternatively, system 100 may be included in the same housing as base system 105 and may even be part of base system 105. System 100 may perform compensation upon user request, or may perform compensation automatically, for example at power up or periodically.

In some examples, mismatch compensation system 100 and/or base system 105 may be implemented at least in part as computer-readable instructions (e.g., software) on one or more computing devices (e.g., servers, personal computers, etc.).

Computing devices generally include computer-executable instructions. In general, a processor (e.g., a microprocessor) receives instructions from a computer-readable medium and executes these instructions, thereby performing one or more processes, including one or more of the processes described herein. Such instructions and other data may be stored and transmitted using a variety of known computer-readable media.

A computer-readable medium (also referred to as a processor-readable medium) includes any tangible medium that participates in providing data (e.g., instructions) that may be read by a computer (e.g., by a processor of a computer). Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASHEEPROM, any other memory chip or cartridge, or any other medium from which a computer can read. Instructions may be transmitted by one or more transmission media, including coaxial cables, copper wire and fiber optics, including the wires that comprise a system bus coupled to a processor of a computer. Transmission media may include or convey acoustic waves, light waves, and electromagnetic emissions, such as those generated during radio frequency (RF) and infrared (IR) data communications.

Computer-executable instructions may be compiled or interpreted from computer programs created using a variety of well-known programming languages and/or technologies, including, without limitation, and either alone or in combination, Java™, C, C++, Visual Basic, Java Script, Perl, PLISQL, Labview, etc.

In general, computing systems and/or devices may employ any of a number of well known computer operating systems, including, but by no means limited to, known versions and/or varieties of the Microsoft Windows® operating system, the Unix operating system (e.g., the Solaris® operating system distributed by Sun Microsystems of Menlo Park, Calif.), the AIX UNIX operating system distributed by International Business Machines of Armonk, N.Y., and the Linux operating system. Examples of computing devices include, without limitation, a computer workstation, a server, a desktop, notebook, laptop, or handheld computer, or some other known computing system and/or device.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners, as is known. A file system may be accessible from a computer operating system, and may include files stored in various formats. An RDBMS generally employs the known Structured Query Language (SQL) in addition to a language for creating, storing, editing, and executing stored procedures, such as the PLISQL language mentioned above. With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be apparent upon reading the above description. The scope of the invention should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the invention is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

Reference in the specification to "one example," "an example," "one approach," "an application," "an embodiment" or similar language means that a particular feature, structure, or characteristic described in connection with the example is included in that example; however, multiple instances of such phrases does not necessarily refer to the same example.

Reference in the specification to "software" includes "firmware", instructions built in to the hardware.

What is claimed is:

1. A method comprising:

determining, in a computing device in a first predefined frequency band within a first predefined time period, a first energy difference between two signals, wherein each of the two signals is received from a circuit in a plurality of circuits and is a filtered version of a source signal received by the circuit;

determining, in the computing device in a second predefined frequency band within a second predefined time period, a second energy difference between the two signals;

determining parameter modification information for the plurality of circuits based on the first and second energy differences, wherein the parameter modification information includes a corner frequency value of a high pass filter in the plurality of circuits;

providing parameter modification information to the plurality of circuits;

establishing an energy difference profile based at least on the first and second energy differences and the first and second frequency bands;

determining a threshold frequency for which an energy difference is substantially the same for frequencies above the threshold frequency and substantially different for frequencies below the threshold frequency;

setting a corner frequency value based on the threshold frequency; and providing the corner frequency value to an input circuit as the corner frequency of the high pass filter.

2. The method of claim 1, wherein the method further comprises:

defining the first predefined frequency band by an analysis circuit high pass filter corner frequency and an analysis circuit first low pass filter corner frequency; and defining the second predefined frequency band by the analysis circuit high pass filter corner frequency and an analysis circuit second low pass filter corner frequency, such that the analysis circuit second low pass filter corner frequency is higher than the analysis circuit first low pass filter corner frequency.

3. The method of claim 1, wherein the method further comprises:

defining the first predefined frequency band by an analysis circuit first high pass filter corner frequency and an analysis circuit low pass filter corner frequency; and defining the second predefined frequency band by an analysis circuit second high pass filter corner frequency and the analysis circuit low pass filter corner frequency, such that the analysis circuit second high pass filter corner frequency is higher than the analysis circuit first high pass filter corner frequency.

4. The method of claim 1, wherein the steps of determining the first and second energy differences each further comprise:

generating a difference signal that is the difference of the two signals; and determining an energy of the difference signal, wherein the parameter modification information includes one of a high pass filter corner frequency for adjusting a high pass filter in the plurality of circuits, and a delay value for adjusting the delay of a delay circuit in the plurality of circuits.

5. A method comprising:

receiving a first input signal from a circuit within a plurality of circuits, wherein the first input signal is a filtered version of a first source signal filtered at least by delaying the first source signal in a first delay circuit within the plurality of circuits;

receiving a second input signal from a circuit within the plurality of circuits, wherein the second input signal is a filtered version of a second source signal filtered at least by delaying the second input signal in a second delay circuit within the plurality of circuits;

filtering the first input signal with a first bandpass filter in a first frequency band and filtering the second input signal with a second bandpass filter in the first frequency band;

generating a difference signal that is a difference of the first input signal and the second input signal;

determining a first energy difference between the first and second input signals filtered in the first frequency band by determining an energy of the difference signal;

determining delay values for the first and second delay circuits based on the first energy difference;

filtering the first input signal with the first or a third bandpass filter in a second frequency band, wherein the first source signal is further filtered by a second delay circuit within the plurality of circuits;

filtering the second input signal with the second or a fourth bandpass filter in the second frequency band; wherein the second source signal is further filtered by a fourth delay circuit within the plurality of circuits;

determining a second energy difference between the first and second input signals filtered in the second frequency band by determining an energy of the difference signal; and determining delay values for the second and fourth delay circuits based on the second energy difference and providing the delay values to the plurality of circuits.

6. The method of claim 5, wherein the first source signal is further filtered by a first high pass filter and the second source signal is further filtered by a second high pass filter, further comprising:

determining corner frequency values for the first high pass filter and the second high pass filter based on the first energy difference.

7. The method of claim 6, wherein the method further comprises:

selecting parameter modification information from the delay values and the corner frequency values; and providing the parameter modification information to the plurality of circuits.

8. An apparatus comprising:

an input circuit having a plurality of input channels and having a filter circuit; and a mismatch compensator having:

an energy measurement circuit that is coupled to the input circuit and that is configured to determine a first energy difference for a first frequency band and a second energy difference for a second frequency band between at least two of the channels;

a compensation circuit that is coupled to the energy measurement circuit and the input circuit, wherein the energy measurement circuit is configured to establish an energy difference profile based at least on the first and second energy differences and the first and second frequency bands so as to determine a threshold frequency, and wherein the compensation circuit is configured to adjust the filter circuit based at least in part on the threshold frequency.

9. The apparatus of claim 8, wherein the threshold frequency has an energy difference that is the same for frequencies that are greater than the threshold frequency and that is substantially different for frequencies that are less than the threshold frequency.

10. The apparatus of claim 9, wherein the filter circuit further comprises a high pass filter.

11. The apparatus of claim 10, wherein the energy measurement circuit further comprises a plurality of rectifiers, wherein each rectifier is coupled to the input circuit, and wherein each rectifier corresponds to at least one of the input channels;

a plurality of integrators, wherein each integrator is coupled to at least one of the rectifiers; and a difference circuit that is coupled to the plurality of integrators.

12. The apparatus of claim 11, wherein the apparatus further comprises a plurality of microphones, wherein each microphone is coupled to at least one of the channels.

13. The apparatus of claim 12, wherein the integrator further comprises:

a input stage;

a comparator that is coupled to the input stage;

a delay circuit that is coupled to the comparator and the input stage; and a counter that is coupled to the delay circuit.

* * * * *